(12) United States Patent
Liu et al.

(10) Patent No.: US 8,253,300 B2
(45) Date of Patent: Aug. 28, 2012

(54) ELECTROSTRICTIVE COMPOSITE AND METHOD FOR MAKING THE SAME

(75) Inventors: Chang-Hong Liu, Beijing (CN);
Lu-Zhuo Chen, Beijing (CN);
Shou-Shan Fan, Beijing (CN)

(73) Assignees: Tsinghua University, Beijing (CN);
Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 684 days.

(21) Appl. No.: 12/482,058

(22) Filed: Jun. 10, 2009

(65) Prior Publication Data

US 2012/0193568 A1     Aug. 2, 2012

(30) Foreign Application Priority Data

Jan. 16, 2009   (CN) .......................... 2009 1 0105116

(51) Int. Cl.
*H01L 41/08* (2006.01)
(52) U.S. Cl. ........ 310/311; 310/357; 310/900; 29/25.35
(58) Field of Classification Search .................. 310/311, 310/357, 800; 29/25.35
See application file for complete search history.

(56) References Cited

U.S. PATENT DOCUMENTS

| | | | |
|---|---|---|---|
| 6,555,945 B1 * | 4/2003 | Baughman et al. | 310/300 |
| 7,608,989 B2 * | 10/2009 | Heydt et al. | 310/317 |
| 7,857,777 B2 * | 12/2010 | Larson et al. | 602/13 |
| 7,898,159 B2 * | 3/2011 | Heydt et al. | 310/317 |
| 2008/0136052 A1 | 6/2008 | Pelrine et al. | |
| 2009/0053515 A1 * | 2/2009 | Luo et al. | 428/339 |
| 2010/0013356 A1 * | 1/2010 | Heydt et al. | 310/334 |
| 2011/0200848 A1 * | 8/2011 | Chiang et al. | 429/4 |
| 2011/0259936 A1 * | 10/2011 | Lichtensteiger | 225/1 |

FOREIGN PATENT DOCUMENTS

| | | |
|---|---|---|
| JP | H05-4312 A | 1/1993 |
| KR | 10-20080102888 | 11/2008 |

OTHER PUBLICATIONS

"Preparation and Application of High Strength Carbon Nanotubes/Polymer Composites", Xue Wei et al., Jiangsu Chemical Industry, vol. 35, No. 3, 2007, 1-6.

Ray H. Baughman, et al., Carbon Nanotube Actuators, Science, V284, p. 1340-1344 (1999).

Lu-Zhuo Chen et al., Electrothermal Actuation Based on Carbon Nanotube Network in Silicon Elastomer, Applied Physics Letters V92, p. 263104 (2008).

Yi-Ning Kuang et al., Advance in Microactuators Based on Thermal Expansion Effect, Journal of Electron Devices V22, No. 3 p. 162-170 (1999) Abstract may be relevant.

Carbon Nanotube Actuators, Ray H. Baughman et al., May 21, 1999 vol. 284, Science.

* cited by examiner

*Primary Examiner* — Mark Budd
(74) *Attorney, Agent, or Firm* — Altis Law Group, Inc.

(57) ABSTRACT

An electrostrictive composite includes a flexible polymer matrix and a plurality of carbon nanotubes dispersed in the flexible polymer matrix. The carbon nanotubes cooperatively form an electrically conductive network in the flexible polymer matrix. A plurality of bubbles are defined by the flexible polymer matrix.

19 Claims, 6 Drawing Sheets

ELECTROSTRICTIVE COMPOSITE AND METHOD FOR MAKING THE SAME

RELATED APPLICATIONS

This application is related to copending applications entitled "ELECTROSTRICTIVE COMPOSITE AND METHOD FOR MAKING THE SAME", filed Jun. 10, 2009 Ser. No. 12/482,040; and "ELECTROSTRICTIVE MATERIAL METHOD FOR MAKING THE SAME AND ELECTROTHERMIC TYPE ACTUATOR", filed Jul. 9, 2009 Ser. No. 12/497,745. The disclosures of the above-identified applications are incorporated herein by reference.

BACKGROUND

1. Technical Field

This disclosure relates to a carbon nanotube based electrostrictive composite and method for making the same.

2. Description of Related Art

Electrostrictive composites are materials that can convert electrical energy, a current or voltage, to mechanical energy, thus imparting a force. Electrostrictive composites have been called artificial muscles due to their similar motion properties.

Referring to FIG. 6, a flexible electrothermal composite 10 according to a prior art is shown. The flexible electrothermal composite 10 includes a flexible polymer matrix 14 and a plurality of carbon nanotubes 12 dispersed therein. The carbon nanotubes 12 cooperatively form a conductive network in the flexible polymer matrix 14. The flexible electrothermal composite 10 is made by the following steps of: (a) preparing a solution of a polymer precursor; (b) immersing the carbon nanotubes in the solution and ultrasonically cleaning the solution; and (c) polymerizing and curing the polymer precursor.

However, the expansion coefficient of the flexible electrothermal composite 10 is relatively small.

What is needed, therefore, is to provide an electrostrictive composite having a relatively greater expansion coefficient and method for making the same.

BRIEF DESCRIPTION OF THE DRAWINGS

Many aspects of one electrostrictive composite and method for making the same can be better understood with reference to the following drawings. The components in the drawings are not necessarily drawn to scale, the emphasis instead being placed upon clearly illustrating the principles of one electrostrictive composite and method for making the same.

Figure 1:
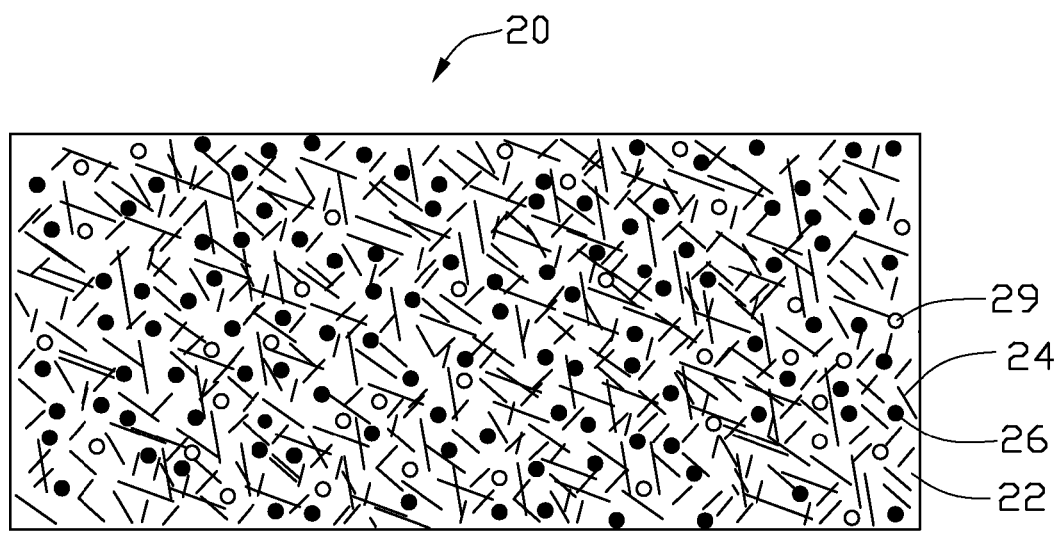
FIG. 1 is a schematic view of an electrostrictive composite.

Corresponding reference characters indicate corresponding parts throughout the several views. The exemplifications set out herein illustrate at least one embodiment of one electrostrictive composite and method for making the same, in at least one form, and such exemplifications are not to be construed as limiting the scope of the disclosure in any manner.

DETAILED DESCRIPTION

References will now be made to the drawings to describe, in detail, various embodiments of one electrostrictive composite and method for making the same.

Referring to FIG. 1, an electrostrictive composite 20 according to one embodiment is shown. The electrostrictive composite 20 includes a flexible polymer matrix 22, a plurality of carbon nanotubes 24, and a plurality of reinforcing particles 26. The carbon nanotubes 24 and reinforcing particles 26 are dispersed in the flexible polymer matrix 22. A plurality of bubbles 29 is defined in the electrostrictive composite 20. Shape and size of the electrostrictive composite 20 is arbitrary. In one embodiment, the electrostrictive composite 20 is rectangular, and the carbon nanotubes 24 and the reinforcing particles 26 are uniformly dispersed in the flexible polymer matrix 22.

A weight percentage of the flexible polymer matrix 22 in the electrostrictive composite 20 ranges from about 80% to about 98.9%. The flexible polymer matrix 22 includes a material selected from a group consisting of silicone elastomer, polyester, polyurethane, epoxy resin, polymethyl methacrylate (PMMA) and combinations thereof. In one embodiment, the flexible polymer matrix 22 is silicone elastomer.

A total weight percentage of the sum of the carbon nanotubes 24 and the reinforcing particles 26 in the electrostrictive composite 20 is less than 20%. A weight ratio of the carbon nanotubes 24 to the reinforcing particles 26 is greater than or equal to 1:1. A weight percentage of the reinforcing particles 26 in the electrostrictive composite 20 can range from about 1% to about 10% and a weight percentage of the carbon nanotubes 24 in the electrostrictive composite 20 can range from about 0.1% to about 10%. In one embodiment, a weight percentage of the reinforcing particles 26 in the electrostrictive composite 20 ranges from about 1% to about 5% and a weight percentage of the carbon nanotubes 24 in the electrostrictive composite 20 ranges from about 0.1% to about 5%.

The carbon nanotubes 24 can be selected from a group consisting of single-walled carbon nanotubes, double-walled carbon nanotubes, multi-walled carbon nanotubes, and combinations thereof. A length of the carbon nanotubes 24 can be greater than about 1 micrometer. The length of the carbon nanotubes 24 can range from about 50 micrometers to about 900 micrometers in one embodiment. The carbon nanotubes 24 are flexible and have excellent electricity to heat conversion efficiency. The carbon nanotubes 24 are in contact with each other to form a conductive network in the flexible polymer matrix 22, thus the electrostrictive composite 20 is conductive. While a voltage is applied to the electrostrictive composite 20, the carbon nanotubes conductive network will rapidly heat and expand the flexible polymer matrix 22.

The reinforcing particles 26 can be made of material selected from a group consisting of ceramic, metal, metal oxide, metal nitride, glass and combinations thereof. An effective diameter of the reinforcing particle 26 can range from about 1 nanometer to about 10 micrometers. The reinforcing particles 26 can reduce the thermal response time of the electrostrictive composite 20 due to its high thermal conductivity. The reinforcing particles 26 can enhance the Young's modulus of the electrostrictive composite 20 and raise its propelling power capability during expansion. In another embodiment, the reinforcing particles 26 in the electrostrictive composite 20 may be omitted.

The bubbles 29 are a plurality of sealed spaces defined in the flexible polymer matrix 22 and filled with gas. The choice of gas is arbitrary and sealed in the bubbles 29. Effective diameters of the bubbles 29 can range from about 1 nanometer to about 100 micrometers. A volume percentage of the bubbles 29 in the electrostrictive composite 20 can range from about 2% to about 50%. In one embodiment, the volume percentage of the bubbles 29 ranges from about 5% to about 20%. Because the bubbles 29 can expand while being heated, a small temperature rise can result in large expansion of the flexible polymer matrix 22. Thus, the expansion coefficient of the electrostrictive composite 20 can be increased because of the addition of the gas containing bubbles.

The work principle of the electrostrictive composite 20 is described as follows. When a voltage is applied to the electrostrictive composite 20, a current flows through the carbon nanotube conductive network. The electric energies absorbed by the carbon nanotubes 24 results in local thermal confinement, which breaks the thermodynamic equilibrium therearound. The current and temperature increase simultaneously and rapidly until another thermodynamic equilibrium is achieved. The temperature of the carbon nanotubes 24 rises by absorbing electrical energy, resulting in a temperature increase of the flexible polymer matrix 22 due to the high thermal conductance of the carbon nanotubes. That can lead to an expansion of the electrostrictive composite 20 along its length and width.

Figure 2:
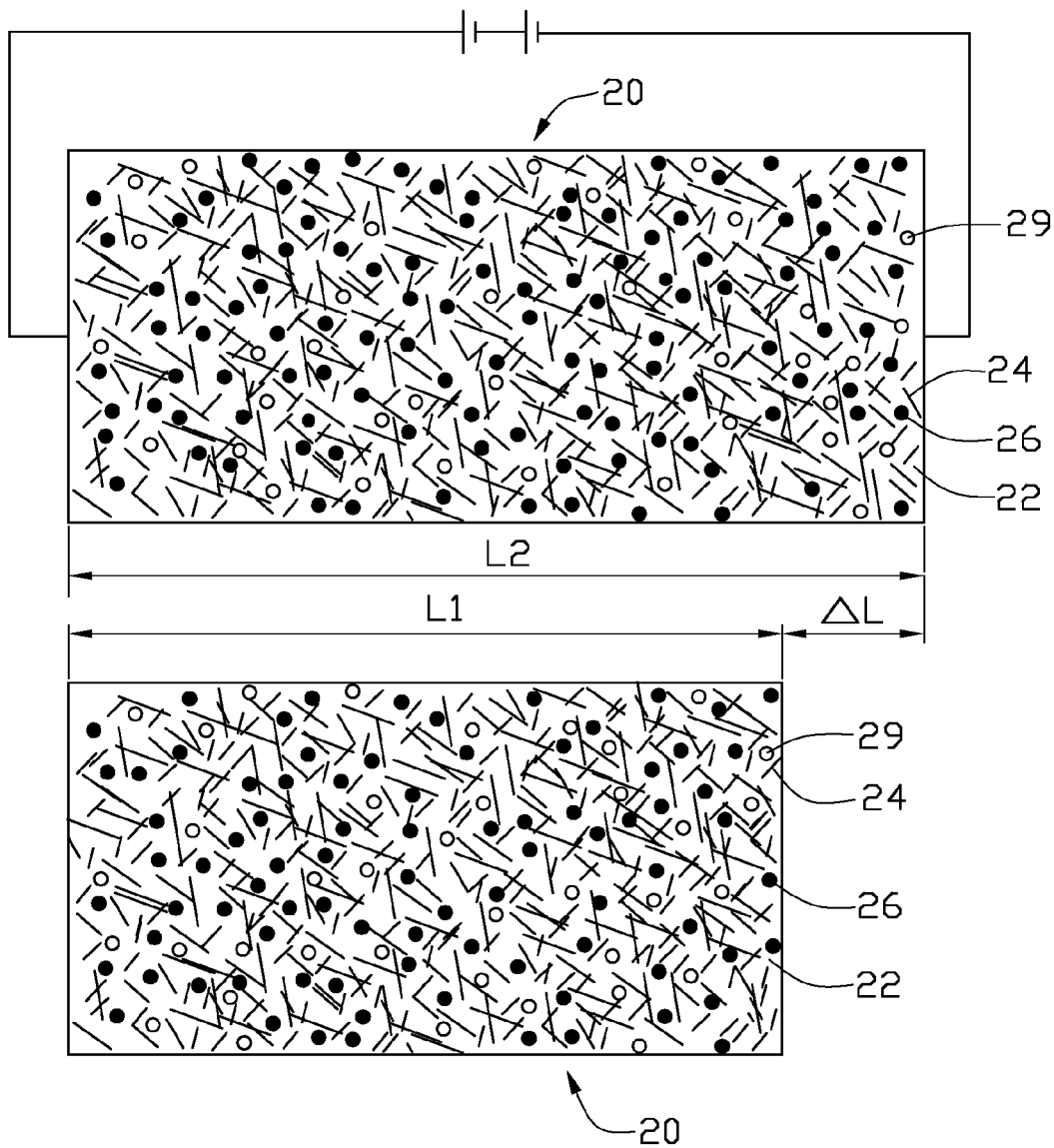
FIG. 2 is the schematic view of an electrostrictive composite of FIG. 1 before and after expansion.

The expansion coefficient of the electrostrictive composite 20 ranges from about 5% to about 10%. Referring to FIG. 2, in one embodiment, the expansion coefficient of the electrostrictive composite 20 is tested. In the tested embodiment of the electrostrictive composite 20, the flexible polymer matrix 22 is silicone elastomer of 91 wt %, the carbon nanotubes 24 are multi-walled carbon nanotube of 5 wt %, the reinforcing particles 26 are $Al_2O_3$ particle of 4 wt %, the volume percentage of the bubbles 29 is 10%, and the diameter of the bubbles 29 range from about 10 nanometers to about 1 micrometer. The effective diameter of the reinforcing particle 26 ranges from about 10 nanometers to about 100 nanometers. The expansion coefficient $\alpha$ of the electrostrictive composite 20 is calculated according to following formula $$\alpha = \frac{L2-L1}{L1} \times \frac{1}{\Delta T} = \frac{\varepsilon}{\Delta T}$$

where L1 is the original length of the electrostrictive composite 20, L2 is the length of the electrostrictive composite 20 after expansion, $\Delta T$ is the increase of the temperature of the electrostrictive composite 20, $\varepsilon$ is the strain. In the tested embodiment, the L1 is 4 millimeters. The L2 increases to 4.3 millimeters after a voltage of 40 V is supplied for about 2 minutes. The increase of the length $\Delta L$ is 0.3 millimeters. The increase of the temperature $\Delta T$ is 150K. The strain $\varepsilon$ of the electrostrictive composite 20 is calculated to be is the 7.5%. The expansion coefficient $\alpha$ of the electrostrictive composite 20 is calculated to be $5.0 \times 10^{-4} K^{-1}$.

Figure 3:
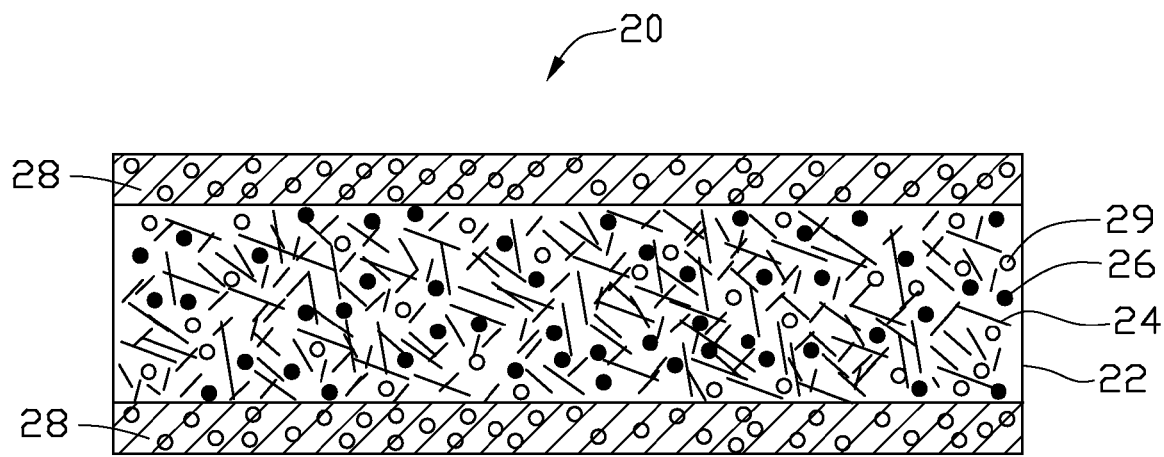
FIG. 3 is a schematic view of an electrostrictive composite having a sandwich structure.
Figure 4:
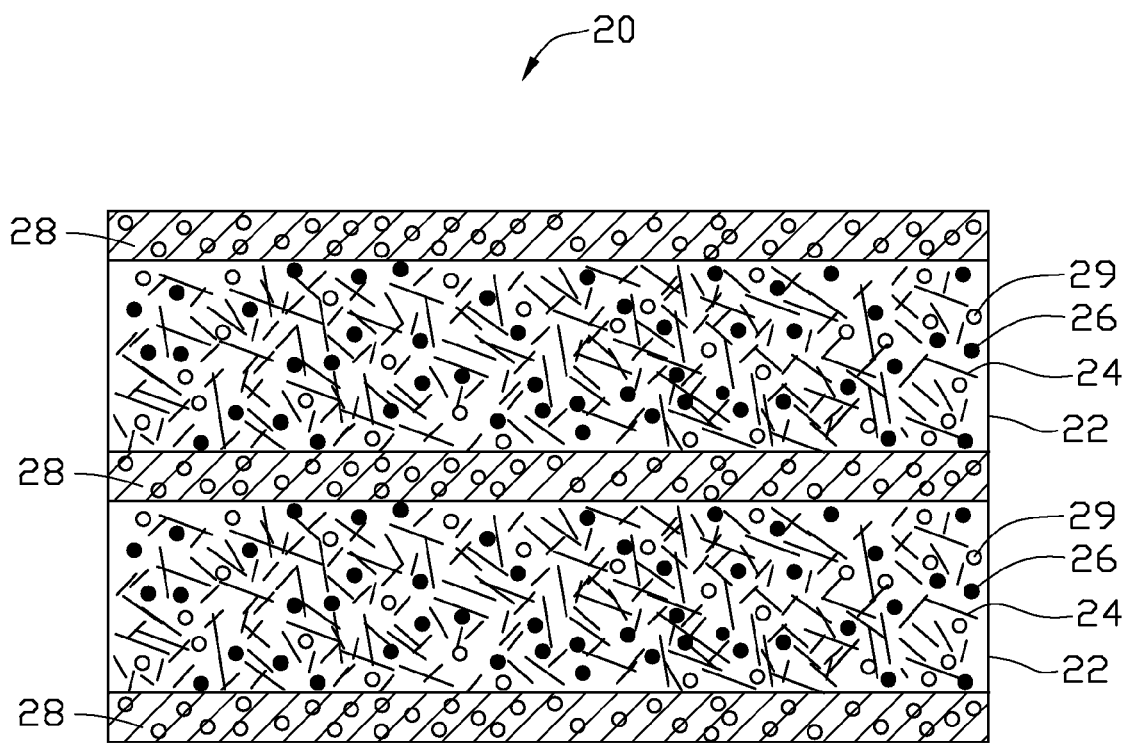
FIG. 4 is a schematic view of an electrostrictive composite having a multi-layer structure.

In other embodiments, the electrostrictive composite 20 can further include at least one flexible polymer layer 28 located on at least one surface of the flexible polymer matrix 22. The flexible polymer layer 28 includes a plurality of bubbles 29 therein. The electrostrictive composite 20 with the flexible polymer layer 28 on at least one surface of the flexible polymer matrix 22 can be an insulator. A thickness ratio of the flexible polymer layer to the flexible polymer matrix 22 can range from about 1% to about 10%. In another embodiment, the flexible polymer matrix 22 can be sandwiched between two silicone elastomer layers serving as the flexible polymer layers 28 as shown in FIG. 3. Alternatively, the electrostrictive composite 20 can be a multi-layer structure as shown in FIG. 4.

Figure 5:
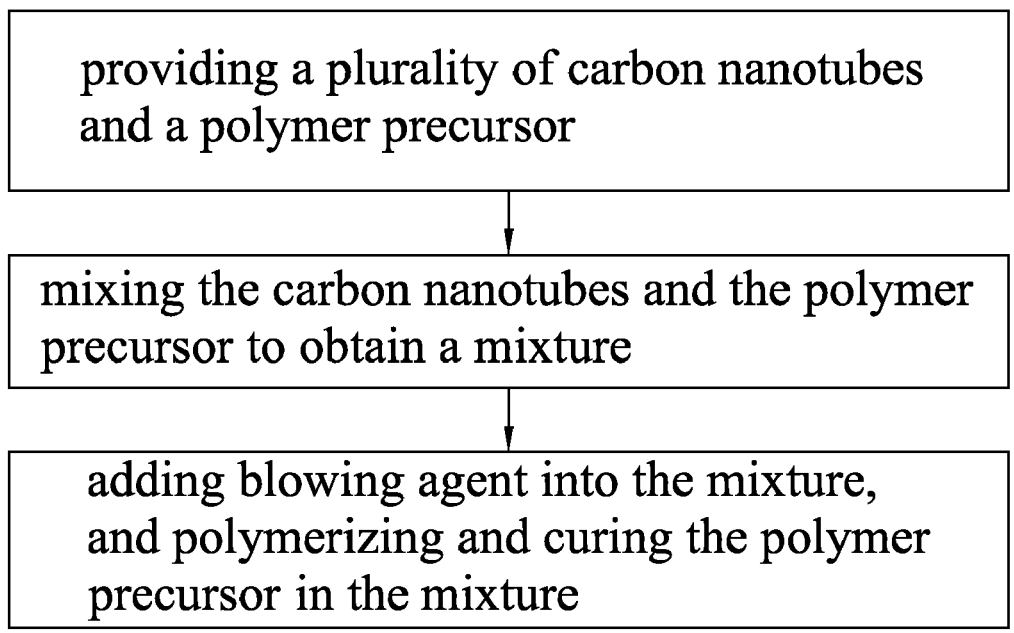
FIG. 5 is a flow chart of a method for making the electrostrictive composite of FIG. 1.
Figure 6:
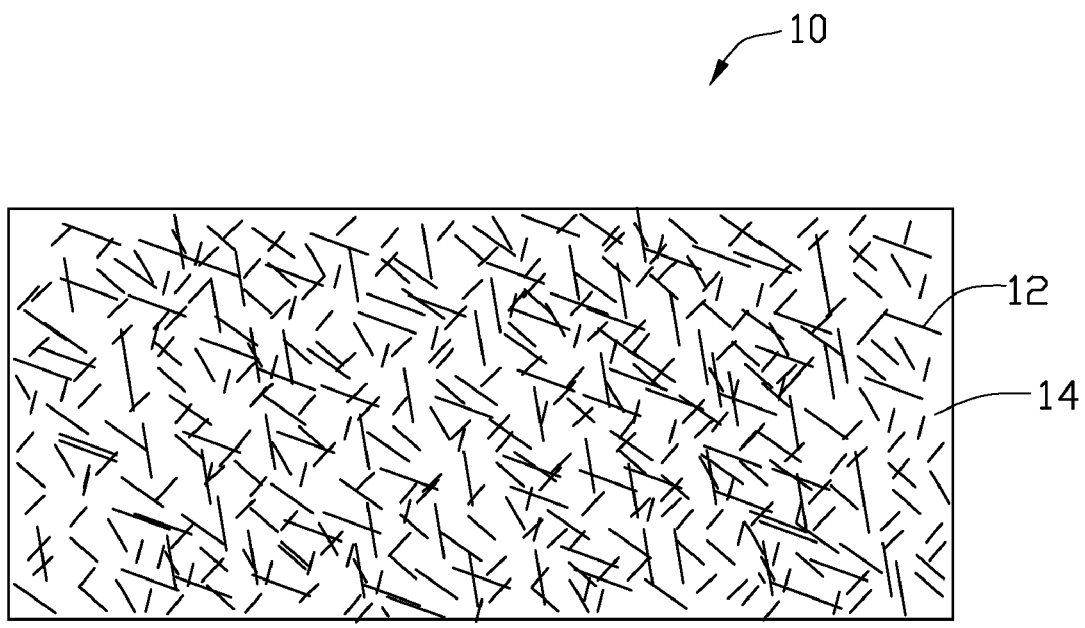
FIG. 6 is a schematic view of a flexible electrothermal composite according to the prior art.

Referring to FIG. 5, a method of making the electrostrictive composite includes the following steps of: (a) providing a plurality of carbon nanotubes and a polymer precursor; (b) mixing the carbon nanotubes and the polymer precursor to obtain a mixture; (c) adding a blowing agent into the mixture, and polymerizing and curing the polymer precursor in the mixture.

In step (a), the carbon nanotubes can be obtained by a conventional method selected from a group consisting of chemical vapor deposition (CVD), arc discharging, and laser ablation. In one embodiment, the carbon nanotubes are obtained by the following substeps of: providing a substrate; forming a carbon nanotube array on the substrate by a chemical vapor deposition method; peeling the carbon nanotube array off the substrate by a mechanical method, thereby achieving a plurality of carbon nanotubes. The carbon nanotubes in the carbon nanotube array can be substantially parallel to each other.

The polymer precursor can be selected according to the flexible polymer. The polymer precursor generally includes a prepolymer or a monomer. The prepolymer can be selected from the group consisting of silicone elastomer prepolymer, polyester prepolymer, polyurethane prepolymer, epoxy resin prepolymer, PMMA prepolymer and combination thereof. In one embodiment, the flexible polymer is silicone elastomer, and the prepolymer is silicone elastomer prepolymer.

In step (b), when the polymer precursor is liquid, the carbon nanotubes can be added into the polymer precursor directly to obtain a liquid mixture. When the polymer precursor is solid or glue-like, step (b) can include the substeps of: (b1) dissolving the polymer precursor into a volatilizable solvent to obtain a solution of polymer precursor; and (b2) adding the carbon nanotubes into the solution to obtain a liquid mixture. In one embodiment, the component A of the silicone elastomer is dissolved into ethyl acetate. The component A can be hydroxyl terminated polydimethylsiloxane.

Step (b) can further include a step of adding a plurality of reinforcing particles in to the liquid mixture. The reinforcing particles can be made by sol-gel or ball milling.

After step (b), a step (d) of ultrasonically treating the liquid mixture can be carried out. In step (d), ultrasonically treatment of the liquid mixture can be performed in an ultrasonic processor for about 10 minutes to reduce the size of the carbon nanotubes and reinforcing particles. In order to avoid the carbon nanotubes conglomerating with each other in the solution, step (d) further includes the following steps of: ultrasonically agitating the solution for a few minutes to uniformly disperse the carbon nanotubes therein. In one embodiment, ultrasonically agitating is performed in an ultrasonic cleaner for about 3 hours.

When the polymer precursor is dissolved into a volatilizable solvent, a step (e) of removing the volatilizable solvent can be performed before the step (c). In one embodiment, the liquid mixture is heated in an oven at a temperature ranging from about 80° C. to about 120° C. until all the ethyl acetate is volatilized.

In step (c), the polymer precursor can be polymerized with an initiator to obtain a flexible polymer matrix having carbon nanotubes dispersed therein. In one embodiment, the initiator includes a solution of ethanol or deionized water having component B of the silicone elastomer dispersed therein. The initiator is added in the solution of the prepolymer having component A of the silicone elastomer to obtain a mixture solution, in order to polymerize the prepolymer. A weight ratio of the initiator and the prepolymer can be about 6:100. In one embodiment, the component A can be hydroxyl terminated polydimethylsiloxane and the component B can be tetraethoxysilane.

The blowing agent can include material selected from a group consisting of n-Pentane, n-Hexane, n-Heptane, petroleum ether, ethanol, dichlorodifluoromethane, dichlorotetrafluoroethane, glycerin and combinations thereof. The blowing agent and the initiator can be added into the mixture together or separately. Then, after ultrasonically agitating the mixture solution, sediment is collected. The blowing volatilizes and generates a plurality of bubbles. The bubbles are sealed in the sediment during the solidifying process. The volume percentage of the bubbles can be controlled by controlling the weight ratio of blowing agent added in the liquid mixture. The sediment (a glue-like material) having the carbon nanotubes and the bubbles uniformly dispersed therein is the electrostrictive composite.

An optional step (f) of pressing the electrostrictive composite can be carried out to obtain a smooth electrostrictive composite after step (c). In one embodiment, the electrostrictive composite is pressed by a smooth presser for about 12 hours to about 18 hours to obtain a planar electrostrictive composite. Furthermore, the planar electrostrictive composite can be cut to have a desired shape.

In addition, a step (g) of forming a flexible polymer layer on at least one surface of the flexible polymer matrix can be carried out after step (f). Step (h) can include the substeps of: (g1) providing a liquid prepolymer; (g2) adding a blowing agent and initiator into the liquid prepolymer to obtain a liquid mixture; and (g3) immersing the electrostrictive composite into the liquid mixture.

It is also to be understood that the above description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An electrostrictive composite comprising:
   a flexible polymer matrix; and
   a plurality of carbon nanotubes dispersed in the flexible polymer matrix, the carbon nanotubes cooperatively forming an electrically conductive network in the flexible polymer matrix, wherein a plurality of bubbles are defined by the flexible polymer matrix.

2. The electrostrictive composite of claim 1, wherein an effective diameter of the bubble ranges from about 1 nanometer to about 100 micrometers.

3. The electrostrictive composite of claim 1, wherein a volume percentage of the bubbles in the electrostrictive composite ranges from about 2% to about 50%.

4. The electrostrictive composite of claim 1, wherein a weight percentage of the carbon nanotubes in the electrostrictive composite ranges from about 0.1% to about 10%.

5. The electrostrictive composite of claim 1, further comprising a plurality of reinforcing particles dispersed in the flexible polymer matrix.

6. The electrostrictive composite of claim 5, wherein a weight percentage of the sum of the carbon nanotubes and reinforcing particles in the electrostrictive composite is less than 20%.

7. The electrostrictive composite of claim 5, wherein a weight ratio of the carbon nanotubes to the reinforcing particles is greater than or equal to 1:1.

8. The electrostrictive composite of claim 5, wherein the reinforcing particles are made of material selected from a group consisting of ceramic, metal, metal oxide, metal nitride, glass and combinations thereof.

9. The electrostrictive composite of claim 5, wherein an effective diameter of the reinforcing particle ranges from about 1 nanometer to about 10 micrometers.

10. The electrostrictive composite of claim 1, wherein the flexible polymer matrix comprises a material selected from a group consisting of silicone elastomer, polyester, polyurethane, epoxy resin, polymethyl methacrylate and combinations thereof.

11. The electrostrictive composite of claim 1, further comprising at least one flexible polymer layer located on one surface of the flexible polymer matrix.

12. An electrostrictive composite comprising:
    a flexible polymer matrix; and
    a plurality of carbon nanotubes dispersed in the flexible polymer matrix, the carbon nanotubes form an electrically conductive network in the flexible polymer matrix, wherein a plurality of sealed spaces filled with gas are defined in the flexible polymer matrix.

13. A method for making an electrostrictive composite, the method comprising the following steps of:
    (a) providing a plurality of carbon nanotubes and a polymer precursor;
    (b) mixing the carbon nanotubes and the polymer precursor to obtain a mixture;
    (c) adding a blowing agent into the mixture; and
    (d) polymerizing and curing the polymer precursor in the mixture.

14. The method of claim 13, wherein step (b) comprises the substeps of:
    (b1) dissolving the polymer precursor into a volatilizable solvent to obtain a solution of polymer precursor; and
    (b2) supplying the carbon nanotubes into the solution of polymer precursor to obtain the mixture.

15. The method of claim 14, further comprising a step (e) of removing the volatilizable solvent, before step (c).

16. The method of claim 13, further comprising a step (f) of ultrasonically treating the mixture, after step (b).

17. The method of claim 13, wherein the blowing agent comprises of a material selected from a group consisting of n-Pentane, n-Hexane, n-Heptane, petroleum ether, ethanol, dichlorodifluoromethane, dichlorotetrafluoroethane, glycerin and combinations thereof.

18. The method of claim 13, wherein the polymer precursor is polymerized with an initiator to form the electrostrictive composite.

19. The method of claim 18, wherein the blowing agent and the initiator are added into the mixture together.

* * * * *